(12) United States Patent
Mohanasundaram et al.

(10) Patent No.: US 11,672,095 B2
(45) Date of Patent: Jun. 6, 2023

(54) EXPANSION MODULE FOR A COMPUTING UNIT FOR A HIGH-PERFORMANCE COMPUTER CABINET AND A METHOD FOR THE TOOL-LESS REPLACEMENT OF AN EXPANSION CARD OF AN EXPANSION MODULE

(71) Applicant: Atos Global IT Solutions and Services Private Limited, Navi Mumbai (IN)

(72) Inventors: Sakthivel Mohanasundaram, Thanjavur (IN); Jithendra Bangera, Bangalore (IN); Vishwas Bs, Bangalore (IN); Amit Hattangadi, Bangalore (IN)

(73) Assignee: BULL SAS, Les CLAYES sous BOIS (FR)

( * ) Notice: Subject to any disclaimer, the term of this patent is extended or adjusted under 35 U.S.C. 154(b) by 80 days.

(21) Appl. No.: 17/481,589

(22) Filed: Sep. 22, 2021

(65) Prior Publication Data

US 2022/0104375 A1 Mar. 31, 2022

(30) Foreign Application Priority Data

Sep. 30, 2020 (EP) ...................................... 20199422
Sep. 13, 2021 (EP) ...................................... 21196329

(51) Int. Cl.
*H05K 5/02* (2006.01)

(52) U.S. Cl.
CPC ........... *H05K 5/0291* (2013.01); *H05K 5/023* (2013.01); *H05K 5/0221* (2013.01)

(58) Field of Classification Search
CPC ....................................................... H05K 5/00
See application file for complete search history.

(56) References Cited

U.S. PATENT DOCUMENTS 5,317,483 A 5/1994 Swindler
6,118,668 A * 9/2000 Scholder ................. G06F 1/184
361/801

(Continued)

FOREIGN PATENT DOCUMENTS

DE 1190992 B 4/1965

OTHER PUBLICATIONS

European Search Report issued in EP20199422, dated Feb. 16, 2021 (15 pages).

*Primary Examiner* — Jerry Wu
(74) *Attorney, Agent, or Firm* — ARC IP Law, PC; Joseph J. Mayo

(57) ABSTRACT

An expansion module for a computing unit of a High-Performance Computer cabinet, the expansion module comprising a casing configured to be removably guided horizontally in a main housing of a computing unit of a High-Performance Computer cabinet, a support card, mounted within the casing, comprising at least one module connector, said module connector being configured to be removably connected to the computing unit, a plurality of card slots connectors, each card slot connector being configured to be removably connected to an expansion card, at least a lever for locking/unlocking the casing to the main housing of the computing unit, said lever being operable manually without using any tools and a handle, pivotable according to a vertical axis, configured for locking/unlocking simultaneously the expansion cards when mounted in the card slot connectors.

7 Claims, 4 Drawing Sheets

(56) References Cited

U.S. PATENT DOCUMENTS

| | | |
|---|---|---|
| 8,107,256 B1 | 1/2012 | Kondrat et al. |
| 2007/0064404 A1 | 3/2007 | Dean |
| 2008/0183933 A1* | 7/2008 | Peng .................... H05K 7/1429 |
| | | 710/302 |
| 2014/0268539 A1 | 9/2014 | Vega et al. |
| 2017/0228339 A1 | 8/2017 | Shao et al. |

* cited by examiner

EXPANSION MODULE FOR A COMPUTING UNIT FOR A HIGH-PERFORMANCE COMPUTER CABINET AND A METHOD FOR THE TOOL-LESS REPLACEMENT OF AN EXPANSION CARD OF AN EXPANSION MODULE

This application claims priority to European Patent Application Number 20199422.5, filed 30 Sep. 2020, and to European Patent Application Number 21196329.3, filed 13 Sep. 2021.

BACKGROUND OF THE INVENTION

Field of the Invention

One or more embodiments of the invention relate to the field of High-Performance Computer (HPC) and the management of the modules of such HPC.

Description of the Related Art

Users expect a HPC to be highly reliable and to have very low downtimes. Under such circumstances, most of the companies who are in the HPC field are searching to propose custom servers adapted to the specific needs of each user.

US20140268539 relates to a toolless storage module system removably coupled to the base plate of the computer. The removable module comprises storage media connectors. The goal of this document is to provide an increased amount of storage by providing a module with hot swappable features. It uses a sled that is removably coupled to the base plate, and a PCB disposed on said sled. A support frame is disposed on the PCB and includes a plurality of support members that are disposed perpendicular to the PCB in order to add a plurality of storage media. However, a user has to disassemble the housing of the storage module in order to remove or add storage media. Moreover, the removal of a specific unit can be made difficult because of the disposition of said media in the support frame.

US20070064404 discloses the mounting of circuit board using standoff on keyhole slots in a wall of the enclosure. The document discloses a simple way to mount a circuit board in an enclosure without tools using standoffs which shape can cooperate with holes in said enclosure. As the locking mechanism is integrated to the housing of the central unit, the accessibility of said mechanism is lessened. The locking system is also simple, as it is a rotating device on the wall of the enclosure that comes into contact with the PCB. Also, as the mechanism is on the enclosure, "hot swappable" feature is difficult to obtain as one has to open the central unit.

Thus, there is a need for a mechanism to make easier the customization of servers by replacing expansion cards components in a central unit, with quick and safe method without turning off the servers.

BRIEF SUMMARY OF THE INVENTION

One or more embodiments of the invention relate to an expansion module for a computing unit for a High-Performance Computer cabinet, the expansion module comprising:
a casing configured to be removably guided horizontally in a main housing of a computing unit of a High-Performance Computer cabinet,
a support card, mounted within the casing, comprising:
at least one module connector, said module connector being configured to be removably connected to the computing unit,
a plurality of card slots connectors, each card slot connector being configured to be removably connected to an expansion card,
at least a lever for locking/unlocking the casing to the main housing of the computing unit, said lever being operable manually without using any tools, and
A handle, pivotable according to a vertical axis, for locking/unlocking simultaneously the expansion cards when mounted in the card slot connectors.

Thanks to embodiments of the invention, the expansion module can be pulled out from the computing unit and the expansion cards can be safely removed after unlocking the handle. Such a handle pivots in a horizontal plane which is advantageous for an expansion module which need to be pushed/pulled out. There is no risk that the handle would be damaged when the expansion module is pushed/pulled out. No tool is required at any step which is advantageous.

The handle may comprise a longitudinal body configured to extend over a mounting plate of each expansion card in a lock position. Each expansion card is immobilized by its mounting plate without using any screw.

The longitudinal body may be L-shaped in order to allow a user to grip to pull the expansion module out of the computing unit.

The casing may comprise a top member which extends laterally along a lateral axis and which is located at a top end of a rear wall of the casing, the top member being configured to sandwich a mounting plate of each expansion card with the handle. The top member and the handle cooperate to immobilize the mounting plates.

The top member may comprise a reception hole and the handle may comprise a fastening element configured to cooperate with the reception hole for locking the handle. The handle can't be operated accidentally. The locking doesn't impact the height of the expansion unit and can be actuated when the expansion module is mounted into the computing unit.

The lever and the handle may be mounted onto opposite side walls of the casing in order to be used as gripping elements for pulling out the expansion unit.

In an unlock position, both the lever and the handle may be configured to extend to the rear in order to be used as gripping elements for manipulating the expansion module.

One or more embodiments of the invention relate also to a computing unit configured to be mounted in a High-Performance Computer cabinet, the computing unit comprising a main casing, a motherboard comprising at least a main connector and at least an expansion module as presented before, the module connector being connected to the main connector, the lever locking the casing of the expansion module to the main casing of the computing unit.

One or more embodiments of the invention relate also to a method for the tool-less replacement of an expansion card of an expansion module, as presented before, in a computing unit comprising the steps:
Unlocking the expansion module from the computing unit by actuating the lever in order to disconnect the expansion module from the computing unit,
Unlocking the expansion cards from the expansion module by pivoting the handle along the vertical axis in order to free the expansion cards,
Pulling the expansion module out of the main casing and
Replacing at least one expansion card.

The method may be carried out while the computing unit is in operation.

BRIEF DESCRIPTION OF THE DRAWINGS

Other features, details and advantages of the invention will become apparent upon reading the description which follows with reference to the appended figures.

DETAILED DESCRIPTION OF THE INVENTION

An expansion module for a computing unit for a High-Performance Computer cabinet and a method for the toolless replacement of an expansion card of an expansion module will now be described. In the following exemplary description, numerous specific details are set forth in order to provide a more thorough understanding of embodiments of the invention. It will be apparent, however, to an artisan of ordinary skill that the present invention may be practiced without incorporating all aspects of the specific details described herein. In other instances, specific features, quantities, or measurements well known to those of ordinary skill in the art have not been described in detail so as not to obscure the invention. Readers should note that although examples of the invention are set forth herein, the claims, and the full scope of any equivalents, are what define the metes and bounds of the invention.

A datacenter comprises several high-performance computing cabinets, called HPC cabinets or "clusters", arranged in rows within the datacenter and configured to house computing units, such as servers, switches and routers, to organize, process and store data. A HPC cabinet is configured to accommodate multiple server units, switches, cords and cables, rails, cable management bars, routers, path panels, and blanking panels.

High performance computing has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing units together.

Figure 1:
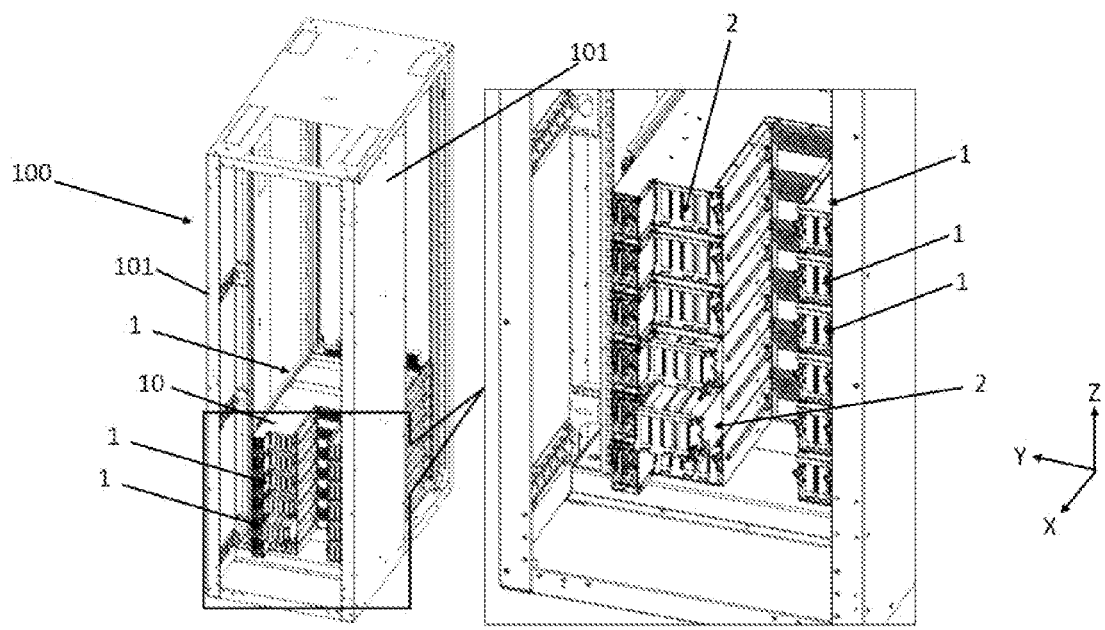
FIG. 1 represents schematically a HPC cabinet comprising several computing units.

As illustrated in FIG. 1, A HPC cabinet 100 comprises two vertical side walls 101, delimiting a central cavity so as to define vertically stacked sockets having a standard height (U). Several computing units 1 are housed in the HPC cabinet 100 and mounted onto the two vertical side walls 101.

Figure 2:
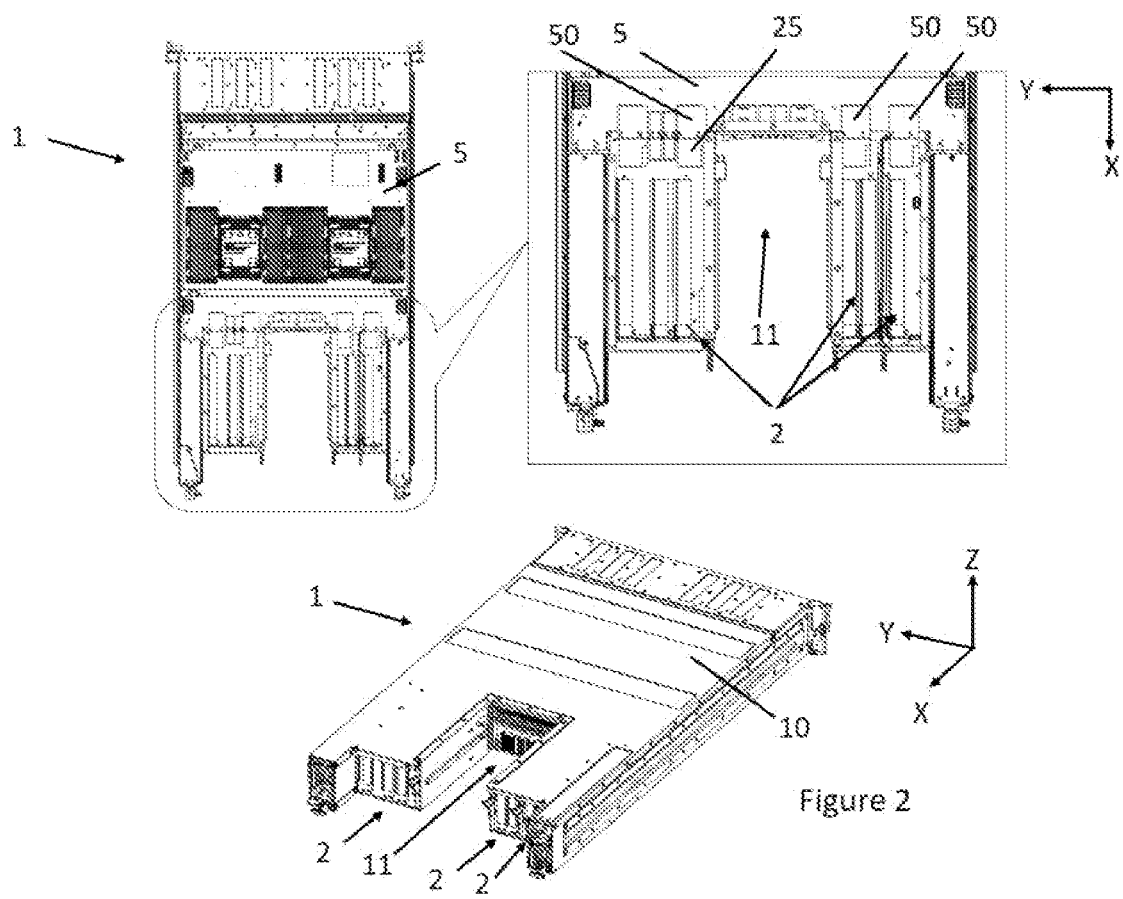
FIG. 2 represents schematically a computing unit according to an embodiment of the invention.

A computing unit 1 according to an embodiment of the invention will be now presented. As illustrated in FIG. 2, the computing unit 1 is presented in a (X, Y, Z) referential in which the X axis extends longitudinally from the front to the rear, the Y axis extends laterally from the right to the left and the Z axis extends vertically from the bottom to the top. The computing unit 1 comprises a main housing 10 in which a motherboard 5 and several expansion modules 2 are mounted. The expansion modules 2 are connected to the motherboard 5. As represented in FIG. 2, the computing unit 1 comprises one large expansion module 2 on the left, two small expansion modules 2 on the right and a central cavity 11 configured to receive an interconnecting module (not represented) for interconnecting together several computing units 1.

The motherboard 5 comprises several main connectors 50 configured to connect to module connectors 25 of the expansion modules 2 so that the motherboard 5 can access expansion cards 3 of the expansion module 2 as it will be presented later.

Figure 3:
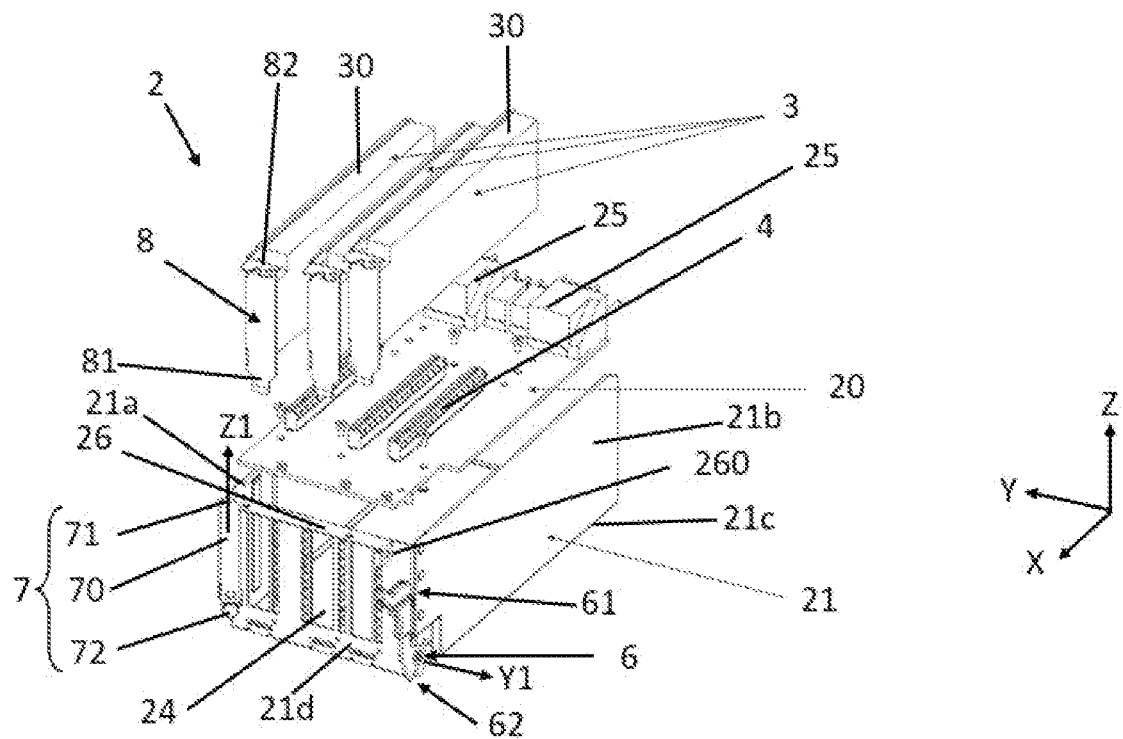
FIG. 3 represents schematically an expansion module according to an embodiment of the invention.

Expansion Module 2 (FIG. 3)

According to an illustrative embodiment of the invention, as represented in FIG. 3, each expansion module 2 comprises:
- a casing 21 configured to be removably guided horizontally in the main housing 10 of the computing unit 1 of an HPC cabinet 100,
- a support card 20, mounted within the casing 21, comprising:
  - at least one module connector 25, said module connector 25 being configured to be removably connected to the computing unit 1,
  - a plurality of card slots connectors 4, each card slot connector 4 being configured to be removably connected to an expansion card 3,
- at least a lever 6 for locking/unlocking the casing 21 to the main housing 10 of the computing unit 1, said lever 6 being operable manually without using any tools, and
- A handle 7, pivotable manually without using any tools according to a vertical axis Z1, for locking/unlocking simultaneously the expansion cards 3 when mounted in the card slot connectors 4.

Each part of the expansion module 2 will be now presented in detail.

As represented in FIG. 3, the expansion module 2 comprises a casing 21 which is configured to be removably guided horizontally in the main housing of the computing unit. The casing 21 is box shaped and is opened from the top and from the front. In other words, the casing 21 comprises two vertical side walls 21a, 21b, a bottom wall 21c and a rear wall 21d. The rear wall 21d comprises vertical openings 24 through which the expansion cards 3 are observable. It is therefore easy to determine whether card slots are still free or not.

The rear wall 21d comprises also a top member 26 which extends laterally along the Y axis and which is located at the top end of the rear wall 21d. The top member 26 comprises a horizontal surface and a reception hole 260 extending laterally along the Y axis as seen in FIG. 3.

The expansion module 2 comprises also a support card 20, mounted within the casing 21, for example, against the bottom wall 21c. The support card 20 is flat and extends horizontally. As represented in FIG. 3, the support card 20 comprises several module connectors 25 located at the front end, said module connectors 25 being configured to be removably connected to the computing unit 1, for example, to the main connectors 50. In this example, the support card 20 can be unplugged from the rear along the X axis by pulling to the rear.

As represented in FIG. 3, the support card 20 comprises a plurality of card slots connectors 4 (three in this example), each card slot connector 4 being configured to be removably connected to an expansion card 3. Each card slot connector 4 extends longitudinally according to the X axis and protrudes vertically from the support card 20 in order to connect to the expansion cards 3 along a vertical translation according to the Y axis.

Each expansion card 3 is for example a "Peripheral Component Interconnect Express" card (PCIe card) meaning any peripheral component which use the high-speed serial computer expansion bus standard PCIe as an interface to connect with the motherboard, such as graphics cards, hard drives, SSDs, Wi-Fi and Ethernet hardware. The skilled man easily understands that even if there are multiple standards and numerous improvements of the PCIe expansion bus, each one can be operated in an embodiment of the invention.

In this example, each expansion card 3 comprises a main body 30 which is box shaped and extends longitudinally according to the X axis and vertically according to the Z axis. The expansion card 3 comprises a bottom connector (not represented) configured to connect to a card slot connector 4 of the support card 20.

Each expansion card 3 comprises also a mounting plate 8, located at the rear of the main body 30, which extends vertically and which comprises a bottom element 81 for cooperating with the module casing 21, for example with a slot defined in the bottom wall 21*c* of the module casing 21, and a top element 82 which extends horizontally, for example, on the top member 26 of the casing 21 so that the top element 82 of the mounting plate 8 is stable on the top member 26. Such an expansion card 3 is well known in the art and won't be presented more in details.

As represented in FIG. 3, the expansion module 2 comprises at least a lever 6 (for example only one) for locking/unlocking the casing 21 to the main housing 10 of the computing unit 1. The lever 6 is pivotable along a Y1 axis between a lock position (top position) and an unlock position (bottom position).

Figure 4:
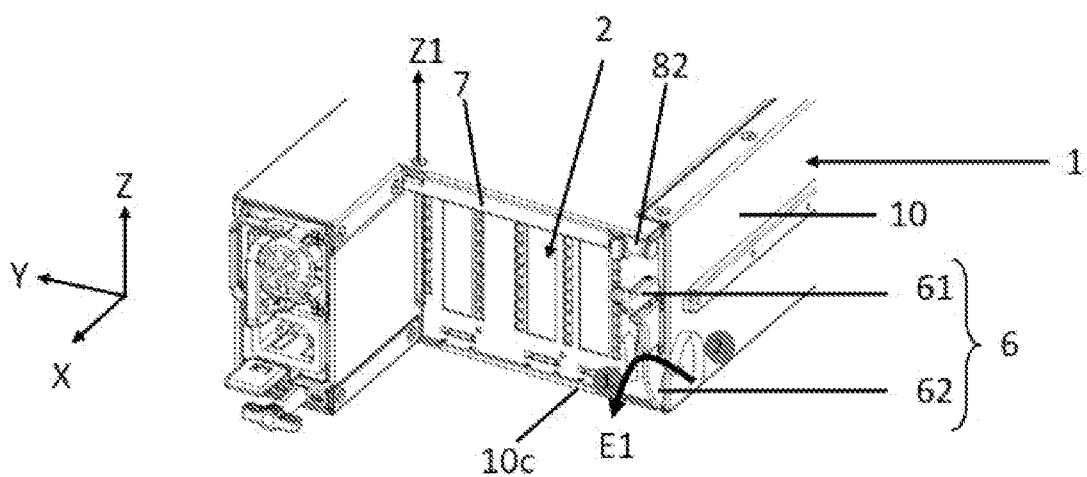
FIG. 4 represents a computing unit with an expansion module in a lock position.

The lever 6 is located at the bottom rear end of the side wall 21*b* of the casing 21 so that to be easily accessible. In this example, the lever 6 comprises a bottom portion comprising at least one tooth 62 configured to cooperate with a bottom wall 10*c* of the main housing 10 of the computing unit 1 (see FIG. 4). In the top position, the lever 6 is configured to lock the expansion module 2 to the main housing 10, the tooth 62 cooperating with the bottom wall 10*c* in order to prevent any movement of the expansion module 2. The bottom wall 10*c* comprises for example a slot for receiving the tooth 62. In the bottom position, the lever 6 is configured to unlock the expansion module 2 from the main housing 10 (See FIG. 5). The tooth 62 is for example cam shaped in order to perform an ejection of the expansion module 2 from the main housing 10 during unlocking and to perform a tightening of the expansion module 2 in the main housing 10 during locking. The tooth 62 acts as a mechanical rotary cam.

Figure 5:
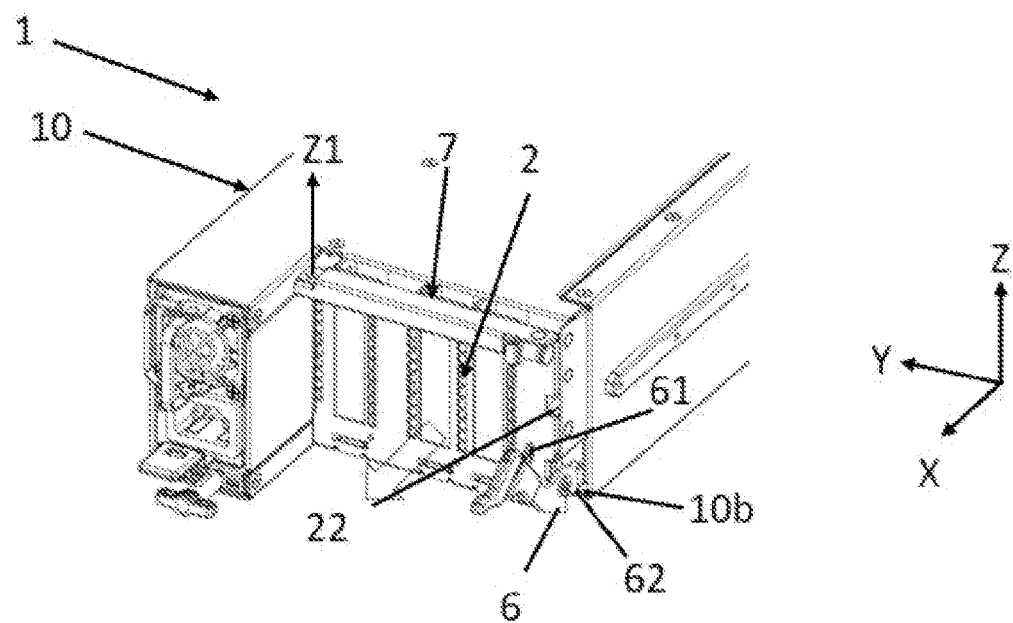
FIG. 5 represents the computing unit according to FIG. 3 with the lever in the unlock position.

As represented in FIG. 5, the lever 6 comprises at least one fastening member 61 configured to maintain the lever 6 in the top position. In this embodiment, the fastening member 61 is configured to cooperate with a recess 22 of the casing 21. For example, the fastening member 61 comprises a pivotable finger and a spring. A user has to actuate the fastening member 61 in order to allow the rotation of the lever 6 to the bottom. The fastening member 61 is movable between a unlock position (top position) and a lock position (down position). The spring of the fastening member 61 pushes the fastening member 61 into the lock position. When the user actuates upwardly the fastening member 61, the finger escapes the recess 22 and the lever 6 can be rotated. An accidental movement of the lever 6 is therefore prevented.

Handle 7

Figure 6:
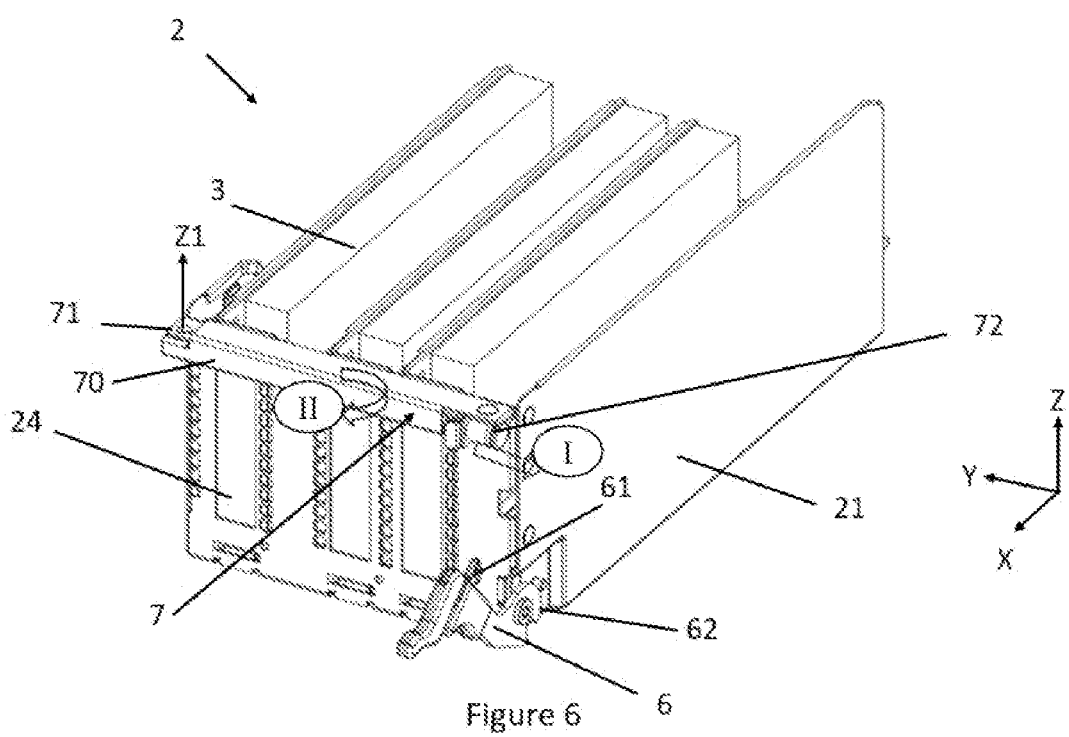
FIG. 6 represents the expansion unit pulled out from the computing unit from FIG. 5.
Figure 7:
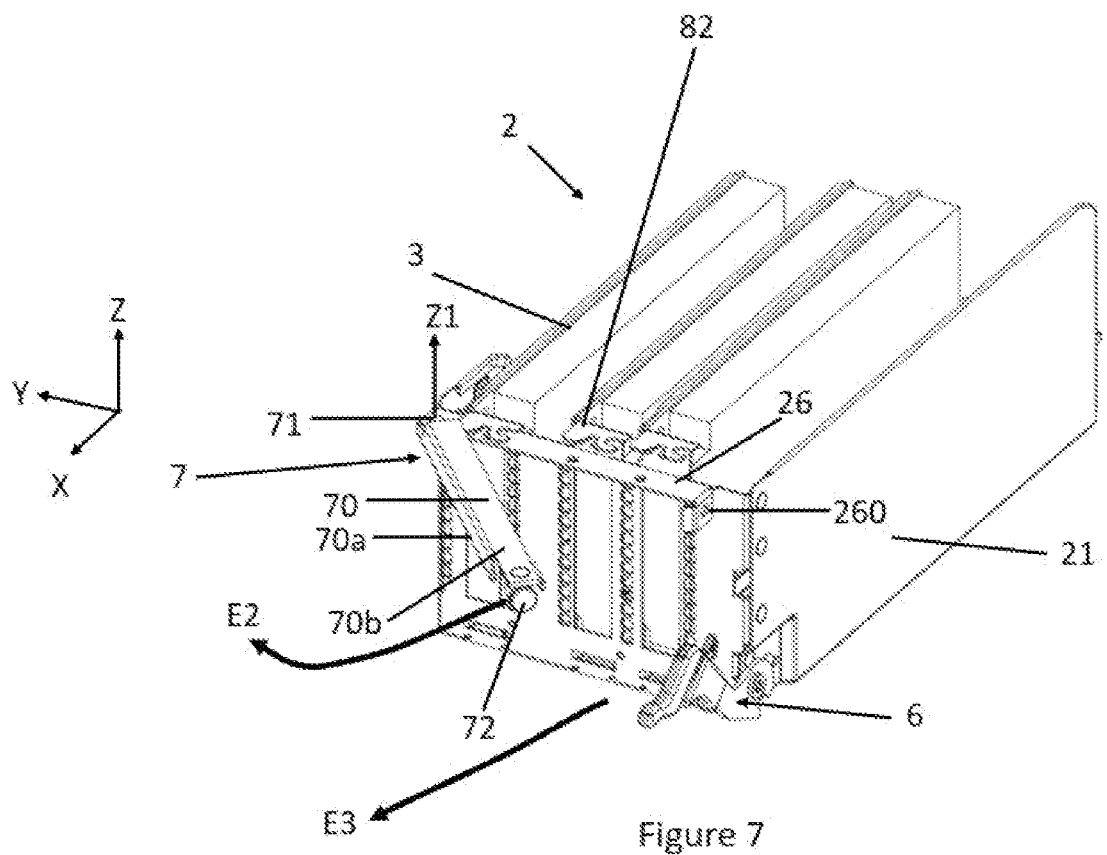
FIG. 7 represents the expansion unit from FIG. 6 with the handle in the unlock position.

According to one or more embodiments of the invention, as represented in FIGS. 6 and 7, the expansion module 2 comprises a handle 7, pivotable according to a vertical axis Z1, configured to lock/unlock simultaneously the expansion cards 3 when mounted in the card slot connectors 4.

The handle 7 comprises a longitudinal body 70 comprising, at a first end, a hinge mechanism 71 for pivoting according to the vertical axis Z1 and, at a second end, a fastening element 72 for locking the handle 7.

In the lock position, the fastening element 72 is located near the lever 6 so that a user can move the lever 6 and then the fastening element 72 very conveniently. Advantageously, the hinge mechanism 71 is located on the opposite lateral side of the lever 6 in the expansion module 2 so that the lever 6 and the handle 8 can be used simultaneously to pull the expansion module 2 out of the computing unit 1 without any burden or effort. In the unlock position, both the lever 6 and the handle 7 can extend parallel to the X axis which allows forming convenient opposite gripping elements for manipulating the expansion module 2 (See FIG. 7).

The fastening element 72 comprises a pin and a spring configured to push the pin in the reception hole 260 of the casing 21 so that the handle 7 is secured in a lock position. Such a fastening element 72 is also called a plunger. The handle 7 is therefore lockable and unlockable manually, without tools. In the lock position, the handle pivoting movement is prevented.

The longitudinal body 70 of the handle 7 is configured to prevent all the expansion cards 3 to move vertically. In the lock position, the longitudinal body 70 extends over the top element 82 of the mounting plate 8 of each expansion card 3, the top element 82 of the mounting plate 8 being sandwiched between the horizontal surface of the top member 26 and the longitudinal body 70 of the handle 7.

The pivoting movement of the handle along the vertical axis Z1 avoids deformation of the handle 7 if not properly locked when the expansion module 2 is pushed back into the computing module 1. The lifespan of the handle 7/expansion module 2 is therefore increased. Moreover, such a pivoting movement allows to transform the lever 6 and the handle 7 into gripping members for removing the expansion module 2.

As represented in FIG. 7, the longitudinal body 70 is L-shaped in order to be gripped by the user for pulling the expansion module 2. In this example, the longitudinal body 70 defines a horizontal front wall 70*a* and a vertical rear wall 70*b*. The horizontal front wall 70*a* is located over the vertical rear wall 70*b*.

Thanks to one or more embodiments of the invention, the expansion module 2 can be swapped while the computing unit 1 is still in operation. In the previous known swapping mechanisms, in order to access the expansion module 2, the computing unit top cover had to be removed, whereas in the present embodiments, the expansion module 2 can be easily ejected longitudinally along the X axis without touching the top cover.

It will now be presented a method for the tool-less replacement of an expansion card 3 in a computing unit 1 comprising the steps:

Unlocking (E1) the expansion module 2 from the computing unit 1 by actuating the lever 6 along the Y1 axis from the top position to the bottom position (FIG. 4) in order to disconnect the expansion module 2 from the computing unit 1, Unlocking (E2) the expansion cards 3 from the expansion module 2 by pivoting the handle 7 along the Z1 axis in order to free the mounting plates 8 of the expansion cards 3 (FIG. 7), and Pulling (E3) the expansion module 2 out of the main casing 10 (FIG. 7) by using the lever 6 and the handle 7 as gripping members or the longitudinal body 70 in order to disconnect the module connectors 25.

For example, when unlocking the expansion cards 3, the user actuates firstly the fastening member 61 of the lever 6 in order to allow the rotation of said lever 6. For example, when unlocking the expansion module 2, the user actuates firstly the fastening member 72 of the handle 7 in order to allow the rotation of the handle 7.

The expansion module 2 can be pulled out after or before pivoting the handle 7.

Figure 8:
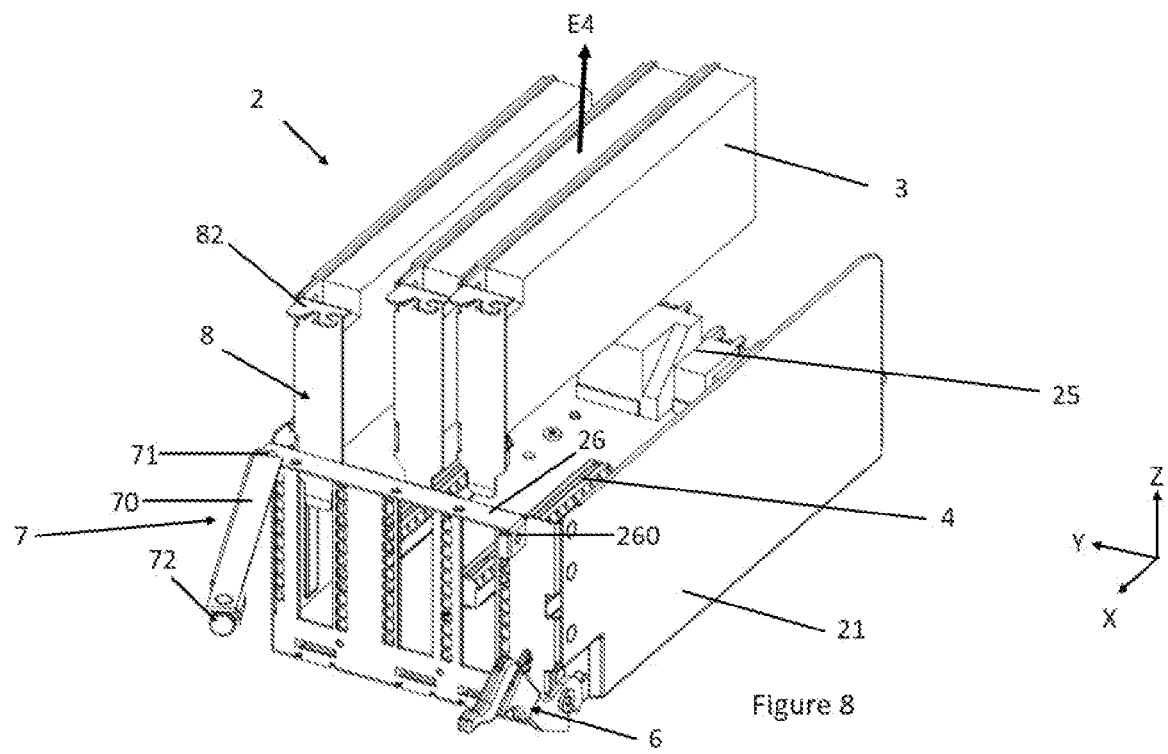
FIG. 8 represents the expansion unit from FIG. 7 during removal of the expansion cards.

If an expansion card 3 need to be replaced, the method comprises a step of removing (E4) vertically an expansion card 3 from said expansion module 2 in order to disconnect the expansion card 3 from the card slot connector 4 (FIG. 8).

If the expansion card 3 needs to be replaced by a new one, all the previous steps can be carried out in a reverse order to reconnect the new expansion card 3.

If the entire expansion module 2 needs to be replaced, it can be directly pulled out from the computing unit 1 and replaced by a new one.

For example, the method is carried out while the computing unit 1 is still in operation.

It will be easily understood upon reading the present application that the particularities of embodiments of the invention, as generally described and illustrated in the figures, may be arranged and designed according to a great variety of different configurations. Thus, the description of the invention and the related figures are not provided for limiting the scope of the invention but simply illustrating selected embodiments.

One skilled in the art will understand that the technical features of a given embodiment may in fact be combined with features of another embodiment unless the opposite is explicitly mentioned or if it is obvious that these features are incompatible. Further, the technical features described in a given embodiment may be isolated from the other features of this embodiment unless the opposite is explicitly mentioned.

It should be obvious for persons skilled in the art that the invention allows embodiments under many other specific forms without departing from the field defined by the scope of the appended claims, these embodiments should be considered as an illustration and the invention should not be limited to the details given above.

What is claimed is:

1. An expansion module for a computing unit for a high-performance computer cabinet, the expansion module comprising:

a casing configured to be removably guided horizontally in a main housing of a computing unit of a high-performance computer cabinet;

the computing unit comprising a motherboard having at least a main connector inside the main housing;

a support card, mounted within the casing, comprising:

at least one module connector, said at least one module connector being configured to be removably connected to the at least a main connector of the computing unit; and a plurality of card slot connectors, each card slot connector being configured to be removably connected to an expansion card;

at least a lever for locking and unlocking the casing to the main housing of the computing unit, said lever being pivotable according to a horizontal axis and located on one side wall of the casing and operable manually without using any tools; and, a handle, pivotable according to a vertical axis on another opposite side wall of the casing, for simultaneously locking and simultaneously unlocking expansion cards when the expansion cards are mounted in the plurality of card slot connectors;

wherein in an unlock position, both the lever and the handle are configured to extend to a rear end in order to be used as gripping elements for manipulating the expansion module.

2. The expansion module according to claim 1, wherein the handle comprises a longitudinal body configured to extend over a mounting plate of each expansion card in a lock position.

3. The expansion module according to claim 2, wherein the longitudinal body is L-shaped.

4. The expansion module according to claim 1, wherein the casing comprises a top member which extends laterally along a lateral axis and which is located at a top end of a rear wall of the casing, the top member being configured to sandwich a mounting plate of each expansion card with the handle.

5. A computing unit configured to be mounted in a high-performance computer cabinet, the computing unit comprising a main casing, a motherboard comprising at least a main connector and at least an expansion module according to claim 1, the at least one module connector being connected to the main connector, the lever locking the casing of the expansion module to the main casing of the computing unit.

6. A method for tool-less replacement of an expansion card of an expansion module, according to claim 1, in a computing unit, the method comprising steps of:

unlocking the expansion module from the computing unit by actuating the lever in order to disconnect the expansion module from the computing unit;

unlocking the expansion cards from the expansion module by pivoting the handle along the vertical axis in order to free the expansion cards;

pulling the expansion module out of the casing to the main housing of the computing unit; and, replacing at least one expansion card.

7. The method according to claim 6, which is carried out while the computing unit is in operation.

* * * * *